United States Patent
Boling et al.

(10) Patent No.: US 8,133,361 B2
(45) Date of Patent: Mar. 13, 2012

(54) THIN FILM COATING SYSTEM AND METHOD

(75) Inventors: Norman L. Boling, Santa Rosa, CA (US); Miles Rains, Santa Rosa, CA (US); Howard Robert Gray, Sebastopol, CA (US)

(73) Assignee: Deposition Sciences, Inc., Santa Rosa, CA (US)

(*) Notice: Subject to any disclaimer, the term of this patent is extended or adjusted under 35 U.S.C. 154(b) by 583 days.

(21) Appl. No.: 12/289,398

(22) Filed: Oct. 27, 2008

(65) Prior Publication Data
US 2009/0145745 A1   Jun. 11, 2009

Related U.S. Application Data

(63) Continuation-in-part of application No. 12/155,544, filed on Jun. 5, 2008.

(60) Provisional application No. 60/996,063, filed on Oct. 26, 2007, provisional application No. 60/924,930, filed on Jun. 5, 2007.

(51) Int. Cl.
*C23C 14/34* (2006.01)
*C23C 14/35* (2006.01)

(52) U.S. Cl. .......... 204/192.13; 204/192.12; 204/298.02

(58) Field of Classification Search .............. 204/192.12, 204/192.13, 298.02, 298.22, 298.23, 298.28
See application file for complete search history.

(56) References Cited

U.S. PATENT DOCUMENTS

| 5,849,162 | A | 12/1998 | Bartolomei et al. |
| 6,485,616 | B1 | 11/2002 | Howard |
| 2002/1019533 | | 12/2002 | Burton et al. |
| 2005/0092599 | A1 | 5/2005 | Boling |
| 2006/0213764 | A1* | 9/2006 | Cerio, Jr. ................. 204/192.12 |

OTHER PUBLICATIONS

International Searching Authority, International Search Report for PCT/US08/12170, mailed Jan. 8, 2009.

\* cited by examiner

*Primary Examiner* — Stephen Rosasco
(74) *Attorney, Agent, or Firm* — Duane Morris, LLP (57) ABSTRACT

A method and system for depositing a thin film on a substrate. In the system a target material is deposited and reacted on a substrate surface to form a substantially non-absorbing thin film. The volume of non-absorbing thin film formed per unit of time may be increased by increasing the area of the surface by a factor of "x" and increasing the rate of deposition of the target material by a factor greater than the inverse of the factor "x" to thereby increase the rate of formation of the volume of non-absorbing thin film per unit of time.

15 Claims, 11 Drawing Sheets

THIN FILM COATING SYSTEM AND METHOD

RELATED APPLICATIONS

The instant application is co-pending with and claims the priority benefit of Provisional Application No. 60/996,063, filed Oct. 26, 2007, entitled "Thin Film Coating System and Method," by the same inventors, the entirety of which is incorporated herein by reference.

The instant application is with and is a continuation-in-part application of U.S. patent application Ser. No. 12/155,544, filed Jun. 5, 2008 which claims the priority benefit of Provisional Application No. 60/924,930, filed Jun. 5, 2007, entitled "Low Cost High Rate Deposition Tooling," the entirety of each are incorporated herein by reference.

BACKGROUND

Figure 1:
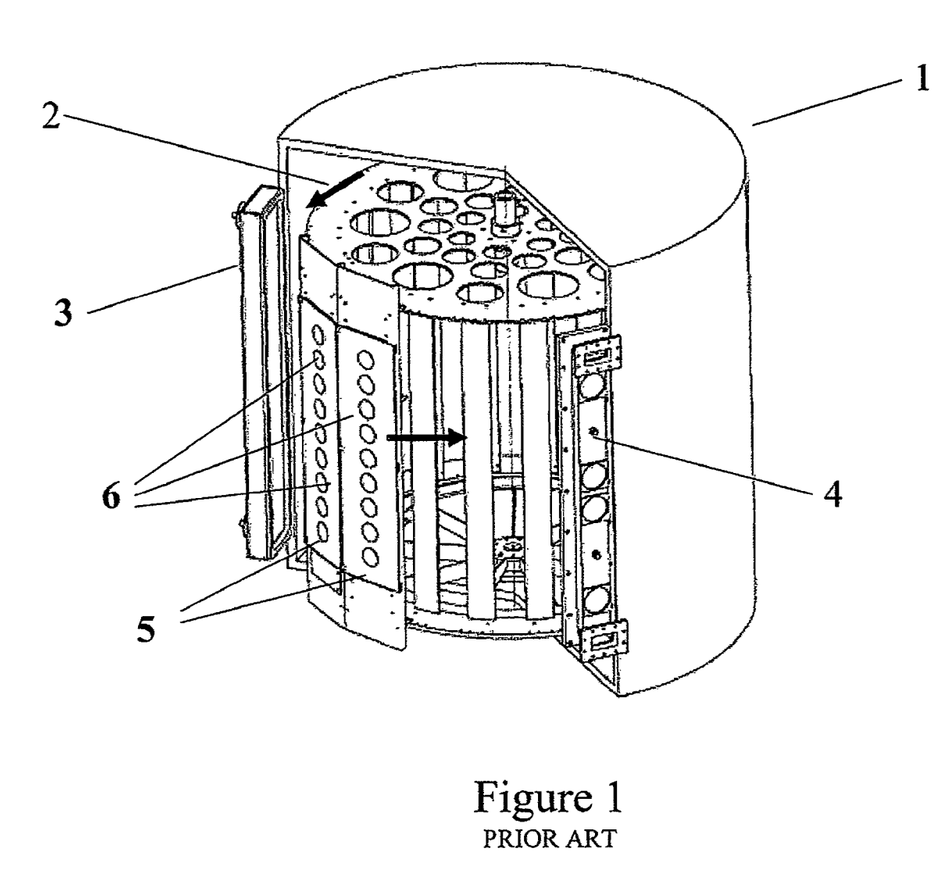
FIGS. 1 and 2 are perspective views of prior art magnetron sputtering systems.
Figure 2:
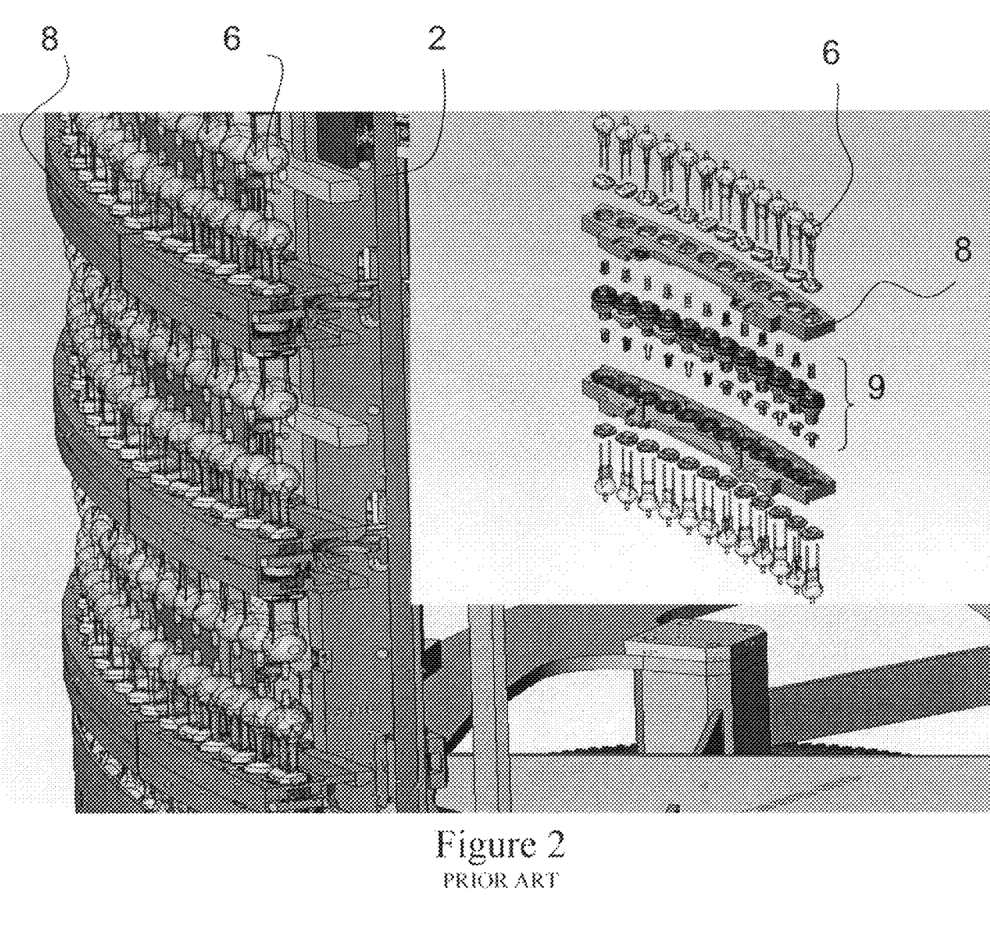

Embodiments of the present subject matter generally relate to the deposition of reactively sputtered thin films on substrates. Exemplary films may be composed of two or more elements including, but not limited to, metal oxides, nitrides and carbides utilized to form non-scattering coatings, scattering coatings, and wear coatings. Exemplary substrates may be, but are not limited to, tungsten-halogen incandescent lamps, solar mirrors, lamp reflectors, lamp burners, and drill bits. Prior art coating systems for these substrates generally utilize magnetron sputtering systems. FIGS. 1 and 2 are perspective views of prior art magnetron sputtering systems. With reference to FIG. 1, conventional magnetron sputtering systems utilize a cylindrical, rotatable drum 2 mounted in a vacuum chamber 1 having sputtering targets 3 located in a wall of the vacuum chamber 1. Plasma or microwave generators 4 known in the art may also be located in a wall of the vacuum chamber 1. Substrates 6 may be removably affixed to panels or substrate holders 5 on the drum 2. With reference to FIG. 2, a plurality of substrates 6, such as lamp burners, may be attached to the rotatable drum 2 via a conventional substrate holder 8. Conventional substrate holders 8 generally include a plurality of gears and bearings 9 allowing one or more lamps 6 to rotate about its respective axis. Material from the sputtering target 3 may thus be distributed around the lamps 6 as they pass a target 3. Obtaining sufficient uniformity in coating generally requires plural rotations past the target 3. Sputtering systems according to embodiments of the present subject matter may move the substrates rapidly and/or repeatedly past the sputtering target so as to limit the material deposited in a single pass to no more than a few atomic mono-layers, and often less than one. Exemplary single-pass material thicknesses may range from about one to thirty angstroms.

Much of the required oxidation in these conventional sputtering systems may occur contemporaneously with the metal deposition past the target, which is usually, but not necessarily, made of a single metal. For clarity purposes, oxidation may be generally defined as the loss of one or more electrons by an atom, molecule, or ion during a chemical reaction. Oxidation is generally accompanied by an increase in the oxidation number on the atoms, molecules, or ions that lose electrons. In embodiments of the present subject matter, oxidation may be completed in other parts of the respective vacuum chamber during the intervals between deposition passes. Oxidation in embodiments of the present subject matter may be conducted with or without the aid of a highly oxidizing source, e.g., a microwave-driven plasma.

One limitation of prior art sputtering systems is the onset of incomplete oxidation as average deposition rates are increased. To avoid incomplete oxidation in conventional systems, power must be limited to the sputtering targets resulting in a reduction of the overall throughput of the system. Further, in systems including oxides requiring transmission in the visible range, this incomplete oxidation may generally be manifested as an absorbing film. Accordingly, there is a need in the art for an exemplary thin film coating method and system that overcomes the shortcomings of the prior art. There is also a need in the art to increase the deposition rate of rutile titania on tungsten-halogen lamps and other substrates without introducing excess absorption.

SUMMARY

It is therefore an aspect of embodiments of the present subject matter to provide a vacuum chamber for deposition of thin films onto substrates through reactive sputtering. Moving substrate holders may be provided to allow the flux from a sputtering target to be distributed over an area larger than the projected area of the substrates onto the sputtering target plane. With this improved geometry and rapid motion of the substrates, an exemplary deposition process may be operated at a higher sputtering rate thereby resulting in an increased throughput of coated substrates.

In another aspect of embodiments of the present subject matter, moving substrate holders may be provided to allow the flux from one or more sputtering targets to be nearly evenly distributed over the substrates by properly phasing the orientation of the substrates during deposition passes by the sputtering targets. With appropriately phased tooling, an exemplary deposition process may be operated at a higher sputtering rate thereby resulting in an increased throughput of coated substrates.

One embodiment of the present subject matter therefore provides a novel method of increasing the volume of non-absorbing thin film formed per unit of time. The method comprises increasing the area of a substrate surface by a factor of x, and increasing the rate of deposition of the target material by a factor greater than the inverse of x to thereby increase the rate of formation of the volume of non-absorbing thin film per unit of time.

Another embodiment of the present subject matter provides a method of forming a non-absorbing thin film on a surface of a substrate. The method comprises operating a sputtering target at a first sputtering rate of target material and exposing the substrate surface to the target at a first exposure rate to effect the deposition of the sputtered target material on the surface of the substrate at a deposition rate per unit of area of substrate surface. The rate of exposure of the substrate surface to the target may then be increased, and the sputtering target operated at a second sputtering rate of target material so that the deposition rate of sputtered target material per unit of area of substrate surface is greater than the product of the ratio of the first exposure rate of substrate surface to the increased exposure rate of the substrate surface and the deposition rate per unit of area of substrate surface.

A further embodiment of the present subject matter provides a coating system having a source of material to be deposited having a selective rate of release of the material, a reactive atmosphere for exposing the deposited material to a reactive agent to effect oxidation of the material, tooling for holding one or more substrates, the tooling having a capacity determining a first surface area of the substrates held thereby, and a carrier supporting the tooling for exposing the substrates held by the tooling to the source of deposition material and the reactive atmosphere at a first area per unit of time to thereby effect a first rate of depositing material per unit area of substrate. A method of increasing the rate of formation of substantially non-absorbing thin film on the one or more substrates may comprise increasing the capacity of the tooling to thereby increase the surface area of substrates held by the tooling, and increasing the area of the substrates exposed to the source of deposition material and the reactive atmosphere per unit of time. The rate of release of the material from the source may then be increased so that the rate of deposition of the material per unit area of substrate is greater than the product of (i) the ratio of the first area per unit of time exposed to the source of deposition material and the reactive atmosphere to the increased area and (ii) the first rate of depositing material per unit area of substrate.

An additional embodiment of the present subject matter provides a method for forming thin films on substrates using a coating system wherein a number of atoms of an element are deposited on an area of substrate surface during a coating cycle and reacted with another element to form a thin film at a first rate of formation. The method comprises increasing the surface area of the substrate and the number of atoms of the element that are deposited on the substrate surface during a coating cycle, and adjusting one or more process parameters including substrate motion to obtain a rate of formation of the thin film per unit area of substrate surface greater than the product of (i) the ratio of the area of the substrate surface having atoms deposited thereon during a coating cycle to the increased area, and (ii) the first rate of formation of the thin film.

One embodiment of the present subject matter provides a sputter coating system having a vacuum chamber having a coating station, a substrate carrier adapted for passing a plurality of identical substrates through the coating station, the carrier being configured to carry a first number of substrates, a means for introducing a reactive gas into said vacuum chamber at a predetermined rate, a target operating at a first predetermined power level sufficient to create a reactive atmosphere in said coating station and to plasma sputter a selected material onto substrates when passed through said coating station by said substrate carrier, and a plasma generator operating at a predetermined power level for increasing the area, density and reactivity of the reactive atmosphere in the coating station. A method for increasing the throughput of substrates in the system may comprise changing the configuration of the substrate carrier to carry a greater number of substrates than the first number, and operating the target at a second predetermined power level, the second power level being greater than the first power level to thereby increase the rate of plasma sputtering of the material onto the substrates.

Yet another embodiment of the present subject matter provides a sputter coating system having a vacuum chamber, a drum rotatable about its axis for carrying a plurality of substrates mounted thereon within the vacuum chamber, a means for introducing a reactive gas into the vacuum chamber at a predetermined reactive gas introduction rate, a target operating at a target power level sufficient to create a reactive atmosphere in a portion of the chamber and to plasma sputter a selected material onto substrates when carried past the target by the rotating drum, and a plasma generator operating at a plasma generating power level sufficient to create a reactive atmosphere within a portion of the chamber. A method of operating the sputter coating system to form a non-absorbing thin film on the substrates may comprise rotating the drum at a selected frequency whereby an increase in the drum rotation frequency will result in an increase in the absorption property of the thin film when the system is operated at the predetermined reactive gas introduction rate, target power level, and plasma generator power level.

These embodiments and many other objects and advantages thereof will be readily apparent to one skilled in the art to which the invention pertains from a perusal of the claims, the appended drawings, and the following detailed description of the embodiments.

DETAILED DESCRIPTION OF THE DRAWINGS

With reference to the figures where like elements have been given like numerical designations to facilitate an understanding of the present subject matter, the various embodiments of thin film coating system and method are herein described. Exemplary films may include, but are not limited to $TiO_2$, rutile $TiO_2$, $SiO_2$, Tin-doped Indium Oxide, $Ta_2O_5$, $Nb_2O_5$, other metals and metal oxides, nitrides and carbides utilized to form non-scattering coatings, scattering coatings, wear coatings, and combinations thereof.

In the preceding paragraphs, embodiments of the present subject matter were viewed macroscopically in terms of the area of the sputtering target relative to that of total substrate area to be coated. For rapid motion of the substrate this macroscopic view may be equivalent to spreading the coating thinly over an area much larger than the area instantaneously adjacent the sputtering target thereby enhancing the average oxidation rate and machine throughput.

Considering embodiments of the present subject matter atomically, one may consider an element having an area dA onto which a film is to be deposited. The area dA may conceptually be assumed to be a one millimeter square and a portion of a large, flat substrate 6 mounted on a drum 2 in the conventional magnetron sputtering system illustrated in FIG. 1. Or, by way of another example, the area dA may be a portion of a substrate 6 attached to a rotatable drum 2 via a conventional substrate holder 8 allowing the substrate 6 to rotate about its own axis as illustrated in FIG. 2. Considering the sputtering system illustrated in FIG. 1, a typical drum 2 may generally be one meter in diameter and one meter in height. A one meter by 0.15 meter sputtering target 3 may be mounted in the wall of the system, and the drum 2 may be rotated at any rate, generally between zero and approximately 200 rpm. At the end of a coating run, all parts of the substrate (s) may be assumed to possess a coating history identical to that of the area dA. Assuming that a one micron thick film is to be deposited in each of several experimental coating runs, variables for the run are drum rotation rate and power to the sputtering target 3. Power generally determines the sputtering rate of metal from the sputtering target 3 and therefore determines the time required to deposit the one micron thick film on an exemplary substrate 6. After each coating run, absorption in the deposited film may be measured.

Figure 3:
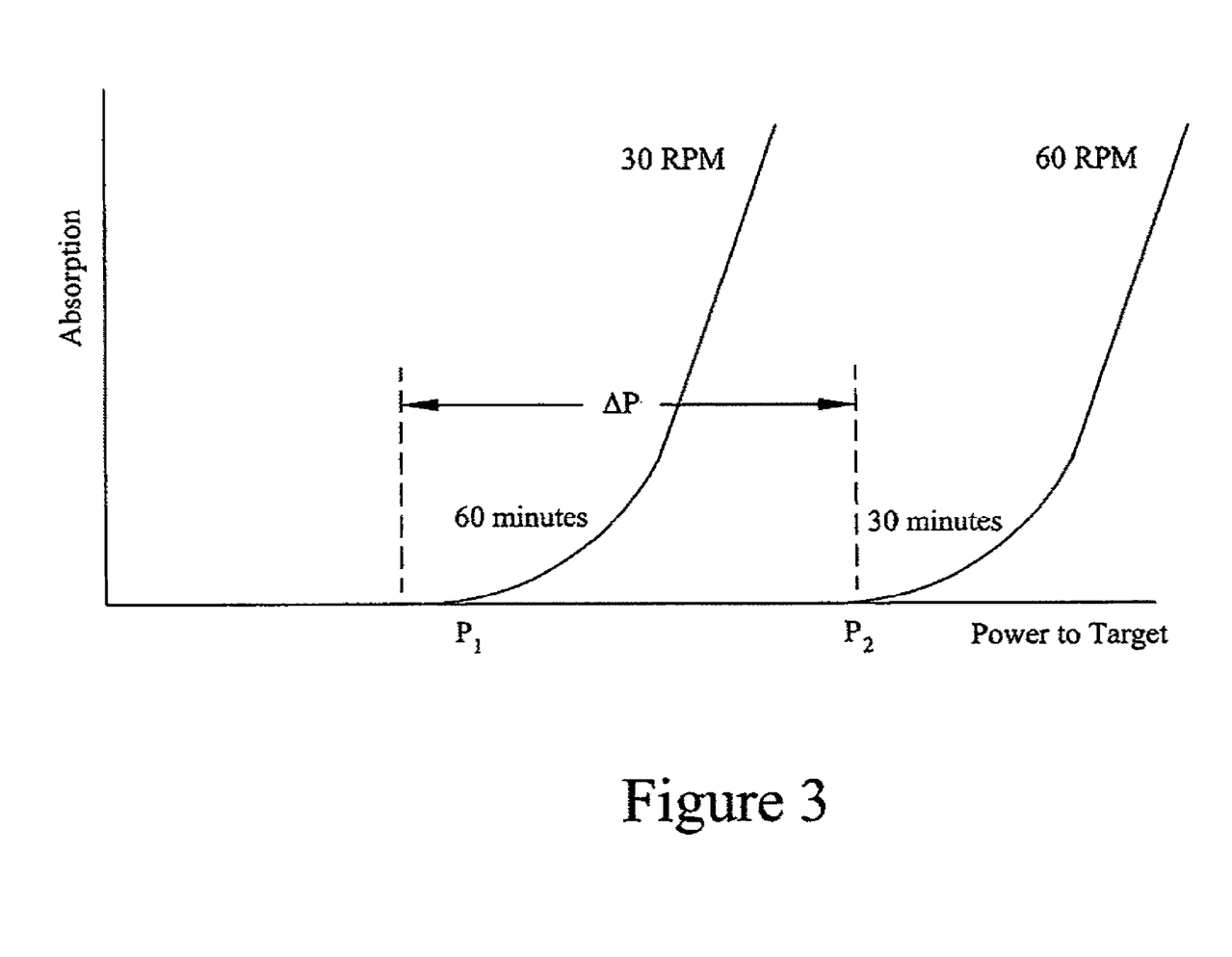
FIG. 3 is a graphical representation of absorption as a function of power and exposure rate to a sputtering target.

FIG. 3 is a graphical representation of absorption as a function of power and exposure rate to a sputtering target. With reference to FIG. 3, results from the above experiment are illustrated utilizing two drum rotation rates, 30 rpm and 60 rpm. For the 30 rpm rotation rate, a low absorption was achieved for powers up to $P_1$ and for the 60 rpm rotation rate, a low absorption was achieved for powers up to $P_2$. As illustrated in FIG. 3, as the power and therefore the rate was increased past $P_1$ or $P_2$ for the respective rotation rates, the film became more absorbing in a nonlinear fashion. Therefore, it follows for a 30 rpm rotation rate, the limiting power for a low absorption is $P_1$ and for a 60 rpm rotation rate, the limiting power for a low absorption is $P_2$. At $P_1$ a nominal 60 minutes was required to deposit the one micron thick film on the area dA and therefore over the whole drum. At the 60 rpm rotation rate, the time for the deposition of the one micron thick film was approximately half the time of the 30 rpm rotation rate. The end result is that throughput for the conventional sputtering system of FIG. 1 may be increased while maintaining a low absorption by increasing the drum rotation rate.

Figure 4A:
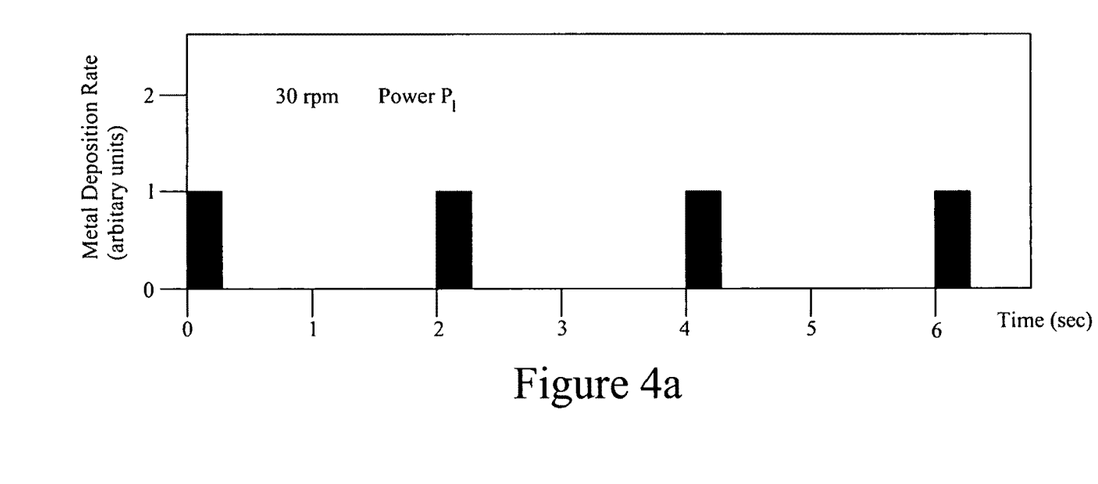
FIGS. 4A and 4B are graphical representations of metal deposition pulse pattern with a drum rotation of 30 rpm and target power P1 and a drum rotation of 60 rpm and target power 2*P1, respectively.
Figure 4B:
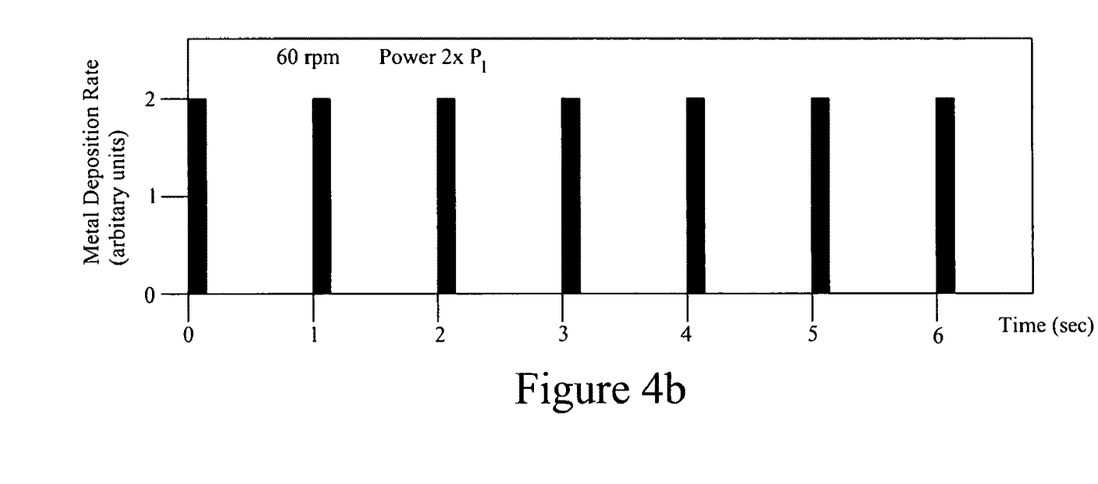

Considering the temporal deposition pattern on area dA in the experiment described above, each time the area dA passes past the sputtering target, the area dA receives a pulse of metal. For a one meter, substrate-carrying drum 2 rotating at 60 rpm past a 15 cm sputtering target, the pulse duration is approximately 50 milliseconds (a "square" spatial distribution of the metal flux from the sputtering target being assumed). At 30 rpm, the pulse duration is approximately 100 milliseconds. The amplitude of each pulse, at either the 30 or 60 rpm rotation rates, is generally proportional to the power applied to the target. FIGS. 4A and 4B are graphical representations of a metal deposition pulse pattern with a drum rotation rate of 30 rpm and sputtering target power $P_1$ and a drum rotation rate of 60 rpm and sputtering target power $2*P_1$ or $P_2$, respectively. These pulse patterns and exemplary processes may be applied to additional tooling and sputtering system configurations exemplified in co-pending and related U.S. patent application Ser. No. 12/155,544 and may be related to deposition film growth.

For a nominal one meter, substrate-carrying drum 2 rotating at 60 rpm, a typical past-the-target rate for $SiO_2$ is generally 100 Å/sec on a flat, non-rotating substrate onto which a non-absorbing film is to be deposited. Therefore, in 50 milliseconds a 5 Å layer may be deposited on each pass past the sputtering target. A 5 Å layer corresponds to approximately one atomic layer. If power (rate) is increased without changing drum rotation rate, the deposited layer thickness during a single pulse may be increased beyond 5 Å and absorption increases. One response would be to increase drum rotation rate thereby allowing higher power while maintaining the 5 Å maximum pulse amplitude, however, if one selects a given power level and measures the absorption as drum rotation rate is increased, the graphical representation illustrated in FIG. 5 results.

Figure 5:
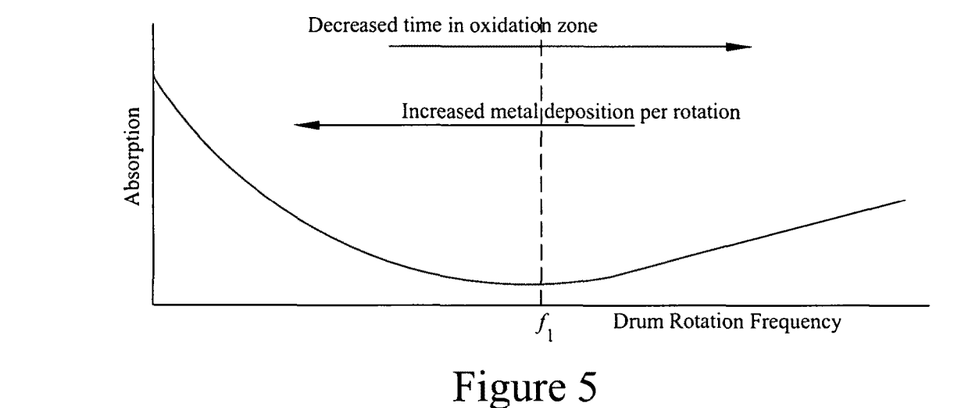
FIG. 5 is a graphical representation of absorption as a function of drum rotation rate at constant target power.

FIG. 5 is a graphical representation of absorption as a function of drum rotation rate at constant target power. With reference to FIG. 5, absorption decreases as drum rotation frequency or rate increases until a minimum is reached at $f_1$. For drum rotation frequencies beyond $f_1$ absorption increases. The illustration of FIG. 5 may be explained with continued reference to FIGS. 4A and 4B. Oxidation of the films deposited by pulses past a sputtering target is conducted in the intervals between the deposition pulses shown in FIGS. 4a and 4b. This oxidation is aided by a localized oxidation plasma generated by a device 4, e.g., microwave generator, etc., mounted in the sputtering system wall. The generator 4 may generally be the same width and height of the sputtering target 3. Therefore, an area dA passing through the oxidizing plasma is subjected to an intense oxidizing pulse while passing the generator 4, just as the area dA is subjected to a metal deposition pulse while passing the sputtering target 3. The oxidative effectiveness of this auxiliary plasma increases as the oxidizing pulse width increases, that is, as the time the area dA is in the plasma zone increases. While a narrow metal pulse in the deposition zone yields a less absorbing film, just the opposite is the case for the oxidizing plasma pulse. Additionally, increasing the drum rotation rate is productive in the metal deposition zone but counter-productive in the oxidation zone. At a certain rotation rate, then, an insufficient oxidation time exists between metal pulses and absorption increases as the rotation rate increases, as exhibited in FIG. 5.

Heretofore, embodiments of the present subject matter have been described utilizing a sputtering system having tooling allowing one degree of rotational freedom, that is, the rotating drum 2 of FIG. 1. Reference will now be made to embodiments of the present subject matter utilizing a sputtering system having tooling allowing two degrees of rotational freedom, a rotating drum 2 and substrates 6 removably affixed to substrate holders 8 where the substrates are adaptable to rotate about their own axes as illustrated in FIG. 2. Exemplary substrates may be, but are not limited to, ellipsoidal tungsten halogen lamps where the ellipsoids are about 2-3 cm in length and approximately one centimeter in diameter. Of course, such an example should not be construed as limiting the scope of the claims appended herewith as embodiments of the subject matter may utilize substrates such as solar mirrors, lamp reflectors, lamp burners, and drill bits. Two to three thousand such lamps 6, each spinning about its individual axis as the drum 2 rotates, may be mounted in an exemplary sputtering system.

Figure 6:
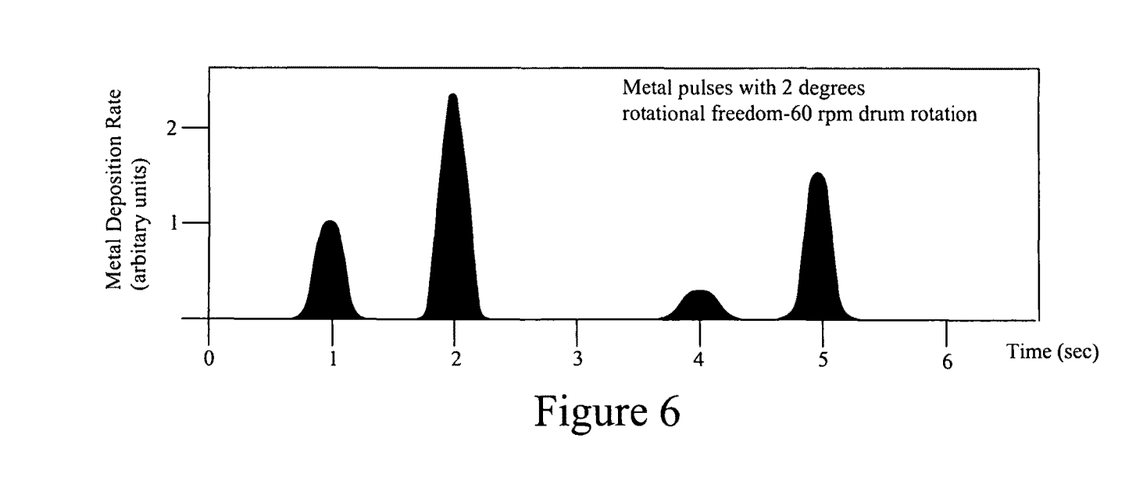
FIG. 6 is a graphical representation of a deposition pulse pattern for an area (dA) on a substrate carried on the sputtering system of FIG. 2.

Utilizing the one square millimeter conceptual area dA described above (now slightly curved on the exemplary cylindrical substrate), it is apparent that the pulse pattern on the area dA is different from that in the previous example due to the more tortuous path followed by the area dA. FIG. 6 is a graphical representation of a deposition pulse pattern for an area dA on a substrate carried on the sputtering system of FIG. 2. With reference to FIG. 6, five passes of the area dA are conceptually illustrated past an exemplary sputtering target for a drum rotation period of one second. In comparison to the previous example having one degree of rotational freedom, it may be seen that pulse shape, width, amplitude and frequency each vary greatly, even at a constant drum rotation rate and constant power to the sputtering target. For example, in some passes the area dA faces the sputtering target as the individual substrate rotates about its respective axis past the sputtering target. While in other passes, the area dA may be turned away from the sputtering target resulting in no deposition of material on the substrate on the respective pass. Therefore, a given thickness per pass cannot be assigned in this example, as it was for the one degree of rotational freedom example. Likewise, a given exposure per pass through the auxiliary plasma cannot be assigned as the oxidation pulses also vary in shape, width, frequency and amplitude.

Unless the substrate spins many times while in the deposition zone, a deposition film layer or nodule uneven in thickness may be deposited on each pass. Layers or nodules from a given pass may possess a thickness ranging from zero to several tens of angstroms, with an respective lateral extent dependent upon drum and substrate rotation rates. It should be noted that the location of the deposited layer or nodule may move about the circumference of the substrate from pass to pass; therefore, the non-uniformity in thickness of the deposited film over the entire substrate may be substantially homogenous after many passes. For example, a one micron thick film on an exemplary substrate may require two to four thousand passes through the deposition zone. A layer or nodule may or may not be deposited on each pass depending upon whether the area dA faces the sputtering target during the pass. With proper phasing from pass to pass, however, a film of substantially uniform thickness may be deposited on the substrate.

If the incremental absorption by a layer or nodule were simply proportional to its thickness, the variation of the layer from pass to pass would not affect the final total absorption of a one micron film, e.g., a 3 Å layer on top of a 5 Å layer would form a composite 8 Å layer with an absorption equal to that of a single 8 Å layer; however, this is not the case as seen through the following experimental analysis. Considering an exemplary drum 2 having a one meter diameter and loaded with plural one centimeter substrates, the tooling required to rotate the substrates may be driven in such a manner that every other (e.g., even) substrate rotates clockwise and odd substrates rotate counterclockwise. A one micron film may then be deposited on this array of substrates. If certain conditions are selected, the odd numbered substrates may be highly absorbing while the even numbered substrates are clear, even though the films on both sets of substrates are one micron thick and uniform thereabout.

Figure 7A:
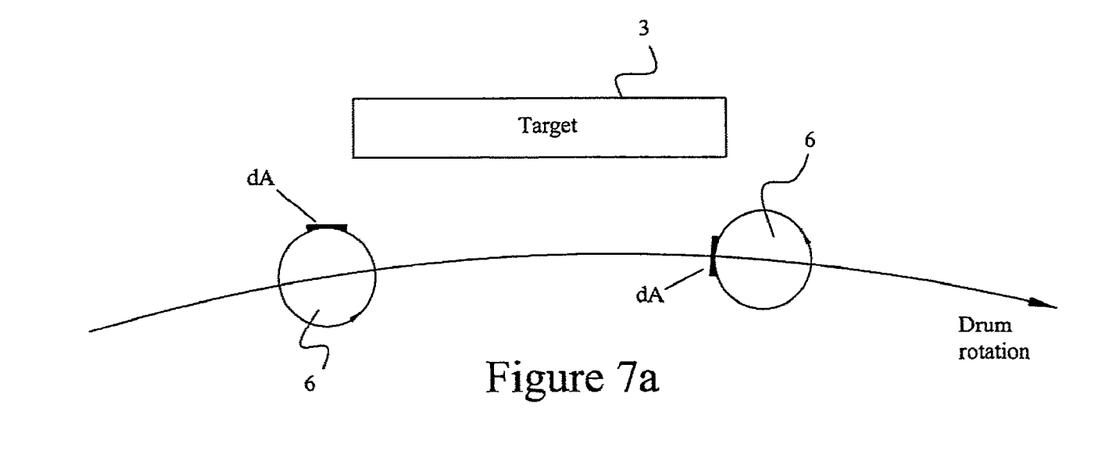
FIG. 7A is a pictorial representation of a substrate or substrate carrier rotating clockwise with the clockwise rotation of an exemplary drum.
Figure 7B:
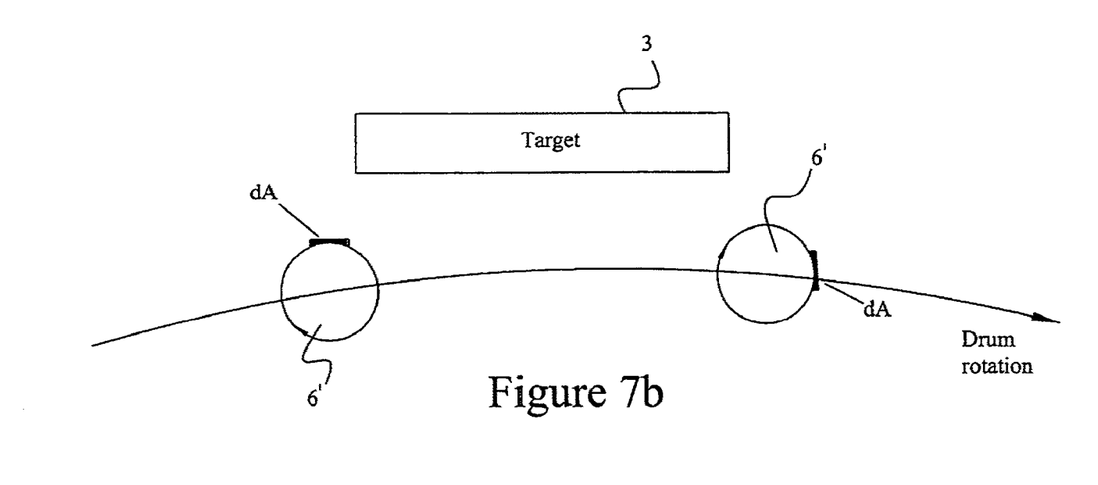
FIG. 7B is a pictorial representation of a substrate or substrate carrier rotating counterclockwise with the clockwise rotation of an exemplary drum.

FIG. 7A is a pictorial representation of a substrate or substrate carrier rotating clockwise with the clockwise rotation of an exemplary drum. FIG. 7B is a pictorial representation of a substrate or substrate carrier rotating counter-clockwise with the clockwise rotation of an exemplary drum. With reference to FIG. 7A, the area dA on the substrate 6 is illustrated as rotating clockwise and entering a flux stream from a sputtering target 3 with an exemplary drum 2 having a clockwise rotational motion. With reference to FIG. 7B, the area dA on the substrate 6' is illustrated as rotating counterclockwise and entering a flux stream from a sputtering target 3 with an exemplary drum 2 having a clockwise rotational motion. Assuming, for purposes of illustration only, that the substrates 6, 6' rotate ninety degrees about their respective axes before their respective midsection lines exit the flux stream, it is clear that the area dA in FIG. 7A has spent less time in the flux steam than has the area dA in FIG. 7B thereby resulting in a greater layer or nodularity on the substrate 6'. A greater layer or nodularity leads to an increased absorption, even though the overall thickness is substantially similar for the substrates 6, 6' which demonstrates the nonlinearity of absorption with respect to layer or nodule thickness.

In practicing embodiments of the present subject matter, it may be helpful to understand the underlying reasons for the nonlinearity described above. Introducing a heuristic model, it may be supposed that as a film is deposited, two types of absorbing oscillators, type 1 and type 2, are generally created, each having a unique absorption spectrum. Type 1 absorbing oscillators are typically associated with isolated, incompletely oxidized metal atoms, the single pass density of which may be represented by $\theta_1$. Type 2 absorbing oscillators are generally comprised of isolated pairs of unoxidized metal atoms joined by metal-metal bonds, the single pass density of which may be represented by $O_2$. Type 2 oscillators, which, due to the need to break the metal-metal bonds, are generally more difficult to oxidize and are formed at higher instantaneous rates of deposition. It should be noted that while production throughput is generally proportional to the average rate, over one drum rotation, absorbing oscillator formation depends on instantaneous conditions as the film is formed adjacent the sputtering target. Thus, when the rate of deposition is low, generally only type 1 absorbing oscillators are created. When the density of type 1 absorbing oscillators becomes high enough, type 2 absorbing oscillators begin to form thereby decreasing the number of type 1 absorbing oscillators during their respective formation. It follows then, that type 2 oscillators should be minimized through an analysis and examination of the relationships between process and tooling parameters, substrate rotation rates, substrate rotation directions, sputtering target widths, number of sputtering targets, drum diameter, shape and amplitude of the deposition pattern past the sputtering target(s), masking, phasing of substrate rotation and exposure in the oxidation zone, and cluster tooling.

The rate of formation of the two types of absorbing oscillators may be represented by a pair of coupled first order differential equations and a pair of non-coupled first order differential equations, one pair for the deposition region and the other for the oxidation region. The pairs of differential equations may be represented by the following relationships:

$$\frac{d\theta_1(t)}{dt} = R(t) - a_1(t)\theta_1(t) - \frac{d\theta_2(t)}{dt} \tag{1}$$

$$\frac{d\theta_2(t)}{dt} = R(t)\theta_1(t) - a_2(t)\theta_2(t) \tag{2}$$

$$\frac{d\theta_1(t)}{dt} = -A_1(t)\theta_1(t) \tag{3}$$

$$\frac{d\theta_2(t)}{dt} = -A_2(t)\theta_2(t) \tag{4}$$

where $\theta_1$ and $\theta_2$ represent the fraction of atomic sties occupied by type 1 and type 2 absorbing oscillators, respectively; R(t) represents the metal deposition rate normalized to the number density of surface atomic sites; $a_1$ and $a_2$ represent the normalized past-target rate of oxidation of type 1 and type 2 absorbing oscillators, respectively; and $A_1$ and $A_2$ represent the normalized rate of oxidation of type 1 and type 2 absorbing oscillators, respectively. Equations (1) through (4) generally describe the formation and extinction of the two types of absorbing oscillators, both in the deposition-oxidation zone and in the oxidation-only zone. Conceptually, an area dA on a substrate passing in front of a sputtering target and then through an oxidation zone may be considered. When the substrate (e.g., a non-rotating flat, a rotating surface of a lamp, etc.) passes in front of the sputtering target, metal atoms are deposited on the surface of the substrate at some defined rate.

If this rate is low, the metal atoms deposited are single, isolated type 1 absorbing oscillators that then pass through the oxidation zone. Preferably, all the metal atoms deposited on a single pass should be oxidized before the substrate passes in front of the sputtering target again. If the rate of deposition of metal is high enough, the metal atoms on the surface do not remain as isolated atoms, but begin to form groups of coupled metal atoms and type 2 absorbing oscillators are then present in the coating. As the type 2 absorbing oscillators begin forming, the density of type 1 absorbing oscillators decreases and the absorption in the film becomes non-linear. This is because the type 2 absorbing oscillators, formed from coupled metal atoms, are more difficult to oxidize than the type 1 absorbing oscillators. If the metal atoms, whether type 1 or type 2, are not fully oxidized before the substrate passes in front of the sputtering target again, the atoms will be buried underneath freshly deposited metal atoms and may become either more difficult or impossible to oxidize thereby leading to the presence of absorption in the deposited film.

It should be noted that in the model described above, some of the factors upon which $\theta_1$ and $\theta_2$ may depend are the width of the deposition zone, W, the diameter of the drum, D, and the frequency of drum rotation, f, to name a few. In the most basic version of the described model, these variables appear in the combination W/Df. As the factor W/Df decreases, absorption decreases. Within the expression one sub-factor may be offset by another if sputtering system design constraints so dictate. For example, doubling the diameter of the drum may have the same effect on lowering absorption as doubling the drum rotation rate. While altering W and/or D may not be practical in an existing sputtering system or coating machine, design of new machines may allow consideration of such. It is therefore an aspect of embodiments of the present subject matter to substantially prevent the formation of type 2 absorbing oscillators in a deposited film to ensure that a deposited film is easier to oxidize and to substantially prevent absorption overall.

Figure 8:
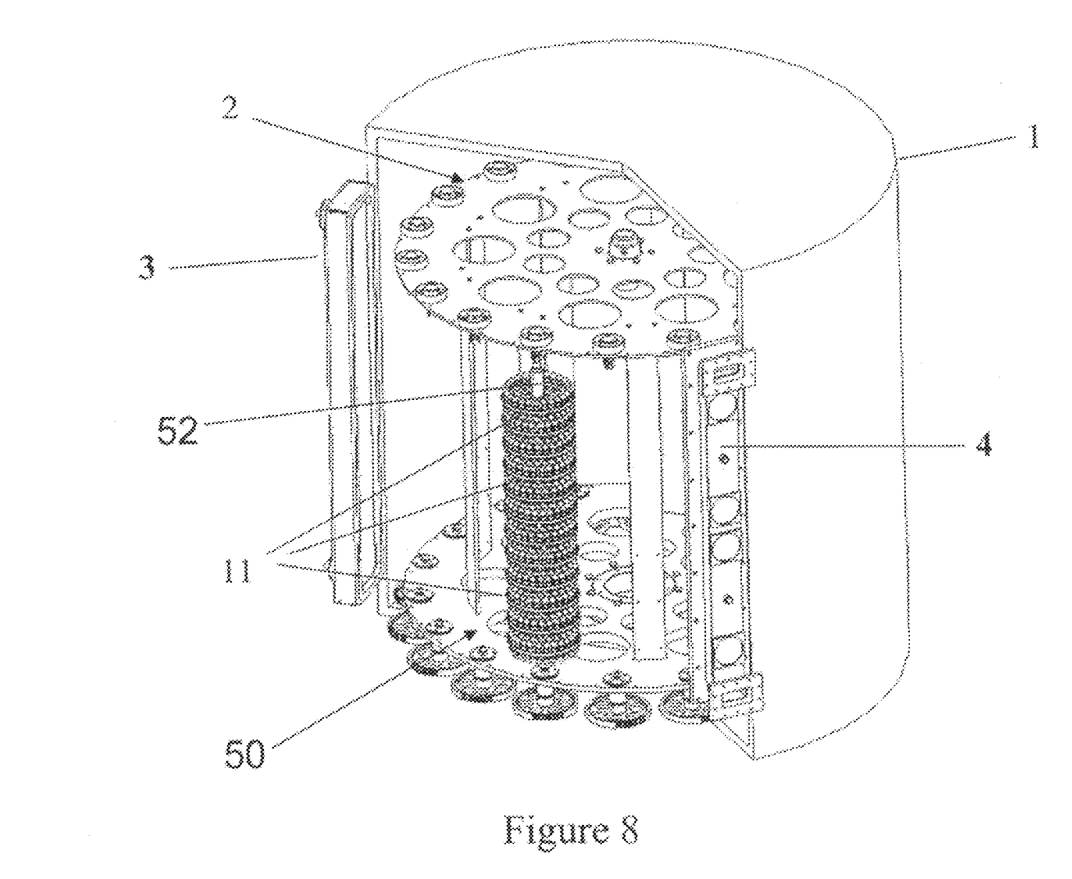
FIG. 8 is a perspective view of a sputtering system according to one embodiment of the present subject matter.

Embodiments of the present subject matter may also be applicable in sputtering systems having tooling allowing at least three degrees of rotational freedom. FIG. 8 is a perspective view of a sputtering system according to one embodiment of the present subject matter. With reference to FIG. 8, an exemplary sputtering system may utilize a substantially cylindrical, rotatable drum or carrier 2 mounted in a vacuum chamber 1 having sputtering targets 3 located in a wall of the vacuum chamber 1. Plasma or microwave generators 4 known in the art may also be located in a wall of the vacuum chamber 1. The carrier 2 may have a generally circular cross-section and is adaptable to rotate about a central axis. A driving mechanism (not shown) may be provided for rotating the carrier 2 about its central axis. A plurality of pallets 50 may be mounted on the carrier 2 in the vacuum chamber 1. Each pallet 50 may comprise a rotatable central shaft 52 and one or more disks 11 axially aligned along the central shaft 52. The disks 11 may provide a plurality of spindle carrying wells positioned about the periphery of the disk 11. Spindles may be carried in the wells, and each spindle may carry one or more substrates, such as a lamp, adaptable to rotate about it respective axis. Additional particulars and embodiments of this exemplary system are further described in co-pending and related U.S. patent application Ser. No. 12/155,544, filed Jun. 5, 2008, the entirety of which is incorporated herein by reference.

The first degree of freedom may be defined as the rotation of the drum. The second degree of rotational freedom may be defined as the rotation of the substrate, and the third degree of rotational freedom may be defined as the rotation of a planet on which the substrates are mounted. Utilizing the one square millimeter conceptual area dA described above (also slightly curved on the exemplary cylindrical substrate), it is apparent to one of skill in the art that the pulse pattern on the area dA is considerably different and more tortuous from that in the previous examples. This allows for greater freedom in selecting exemplary deposition and oxidation pulse characteristics thereby leading to higher target power and an increased sputtering system throughput before the onset of absorption.

While examples of the present subject matter have discussed pulse characteristics, phasing of deposition pulses to each other, oxidation region pulses to each other, and deposition pulses to oxidation pulses may also be utilized to achieve a substantially uniform and oxidized film on a substrate surface. It is therefore an aspect of certain embodiments of the present subject matter to achieve higher sputtering system throughput by selecting the phasing of rotation to increase the time in an oxidation zone relative to the time in a deposition zone. For example, if a layer or nodule is deposited in a given pass past a sputtering target, it may be desirable to have the phasing in the auxiliary plasma zone so that the layer or nodule has a maximum exposure to the plasma. Such phasing may be accomplished through the design of the rotating tooling fixtures discussed in co-pending and related U.S. patent application Ser. No. 12/155,544. By way of further example, when coating rotating substrates, the phasing of the rotation angles past the sputtering target with those in a remote oxidation zone may be important if the oxidizing action in the remote oxidation zone is not isotropic around the substrate. Such may be the case when the remote oxidizer is an ion gun (highly directional) or if a microwave plasma does not uniformly envelop a respective substrate. Selection of the phasing of rotation is important as applied to a single-pass sputtering system. For example, if the single-pass metal coating is uneven around a substrate as the substrate exits the deposition zone, absorption may be present at a greater level due to a greater level of type 1 and 2 absorbing oscillators. Therefore, this uneven coated portion should be oriented toward the oxidizing source as it passes through the remote oxidizing zone.

Other embodiments of the present subject matter may achieve higher sputtering system throughput by shortening the metal pulse width while increasing the pulse frequency. This may be accomplished by increasing the drum rotation rate, increasing the drum diameter while keeping metal deposition zones constant in spatial width, increasing the substrate rotation rate, increasing the planet diameter and/or rotation rate, and combinations thereof.

One embodiment of the present subject matter may achieve higher sputtering system throughput by decreasing the deposition pulse frequency while increasing oxidation pulse width and/or frequency using multiple degrees of rotational freedom. An additional embodiment of the present subject matter may achieve higher sputtering system throughput by increasing the spatial width of the metal deposition zone past the sputtering target thereby increasing the partial oxidation.

Another embodiment of the present subject matter may utilize masking to affect absorption characteristics. Masking in coating machines is generally perceived as a means for controlling uniformity of deposited film through shadowing or by deliberately shadowing portions of a substrate according to a predetermined design. As the previously described model illustrates, however, anything that affects the shape or magnitude of the metal deposition pattern through which a substrate passes will, when the process is operating on the edge of allowed absorption, change the absorption characteristics of the film. Therefore, embodiments of the present subject matter may provide masking and/or substrate tooling that alters the shape or strength of the deposition pattern in a way that is advantageous with regard to absorption. Exemplary masking may be provided in many forms such as, but not limited to, a mask that momentarily blocks metal deposition as a substrate moves through the deposition zone to thereby influence absorption under certain conditions.

A further embodiment of the present subject matter may achieve higher sputtering system throughput by dividing the sputtering target into two sputtering targets separated by an oxidation zone. As discussed above, type 2 absorbing oscillators should be kept as low as possible to optimize film oxidation. In a single sputtering target system, the sputtering target power (i.e., the average coating rate) may be brought to a level upon which unacceptable absorption commences, $P_1$. One method to increase the average coating rate is to utilize two sputtering targets at once rather than a single sputtering target with a reaction zone therebetween. This design essentially interrupts the deposition zone, allowing further oxidation of the film deposited past the first sputtering target before the substrate enters the deposition zone of the second sputtering target. Since the creation rate of type 2 absorbing oscillators is a nonlinear function of the instantaneous metal deposition rate, each sputtering target may be operated at a power greater than $P_1/2$ but lower than $P_1$ while maintaining absorption at the level produced by operating one sputtering target at $P_1$. Therefore, each of the two sputtering targets may be operated at a lower power than that of a single sputtering target, but the combined power to the two sputtering targets is greater than that allowed with only a single sputtering target thereby resulting in a higher average coating rate.

An additional embodiment of the present subject matter may also employ exemplary tooling in a disk coating machine as described in co-pending and related U.S. patent application Ser. No. 12/155,544. It is an aspect of one embodiment of the present subject matter to provide novel tooling, significantly thinner than conventional racks and tooling, without gears or bearings to house to thereby greatly reduce shadowing and improve coating uniformity. For example and with reference to FIG. 8, an exemplary sputtering system may include a substantially cylindrical, rotatable drum or carrier 2 having a plurality of pallets 50 mounted thereon. Each pallet 50 may comprise a rotatable central shaft 52 and one or more disks 11 axially aligned along the central shaft 52 whereby the disks 11 may provide a plurality of spindle carrying wells positioned about the periphery of the disk 11 and each spindle may carry one or more substrates adaptable to rotate about it respective axis. The substrate, drum and pallet may each possess their own respective rate of rotation. This effectively results in a lowering of the creation rate of type 2 absorbing oscillators at a given sputtering target power as the metal is deposited over a greater area. This also allows higher average coating rates before unacceptable absorption occurs. While such tooling has been referenced with a drum type sputtering system, such an example should not limit the scope of the claims appended herewith as embodiments of the present subject matter are equally applicable to in line coating mechanisms or sputtering systems as well as other sputtering systems. It is thus an aspect of embodiments of the present subject matter to provide a novel method for increasing the throughput of substrates having a non-absorbing thin film by changing the configuration of a substrate carrier in a sputter coating system to carry a greater number of substrates and operating a sputtering target in the system at a predetermined power level to increase the rate of plasma sputtering of target material onto the substrates.

Embodiments of the present subject matter employed in an in line coating mechanism or sputtering system may be utilized to coat any number or type of substrate. Unlike drum type sputtering systems, an in line sputtering system generally does not require as many coating passes, rather, exemplary substrates may be coated in one long, continuous coating pass normally requiring a slow coating rate to ensure complete oxidation. Embodiments of the present subject matter may rotate the substrates at a rotational rate such that an area of the substrate exposed to the coating material moves to one side of the tooling before type 2 absorbing oscillators are formed thereby allowing the coating to be fully oxidized before the substrate rotates to another side of the tooling and receives additional coating material. In such embodiments, the oxidation process may also be improved by the presence of a microwave driven plasma or an ion gun at one side of the tooling. Exemplary rotation speeds may result in less material being deposited per pass, but may allow sputtering targets on the in-line coater to be operated at a higher power thereby resulting in a faster average coating rate than would otherwise be possible.

One embodiment of the present subject matter may also achieve higher sputtering system throughput by selecting the rotation direction of the substrate and/or planet to be the same as that of the drum. As discussed above with reference to FIGS. 7A and 7B, substrates rotating in one direction may exhibit an amount of absorption that differs from that shown by the substrates rotating in the other direction due to single pass non-uniformity. The nature of this non-uniformity may be such that it is not possible to have the same absorption (or lack thereof) in both sets of substrates while at the same time maximizing the average deposition rate. Exemplary tooling allowing all of the substrates lamps to rotate in the same direction may minimize the absorption for all of the substrates.

It should be noted that several of the embodiments described above, address rotating substrates or lamps. This should not be construed as limiting the scope of the claims appended herewith as embodiments of the present subject matter are also applicable to other rotating substrates such as rotating flats, e.g., planar flats, triangular flats, and other suitably shaped flats.

Figure 9:
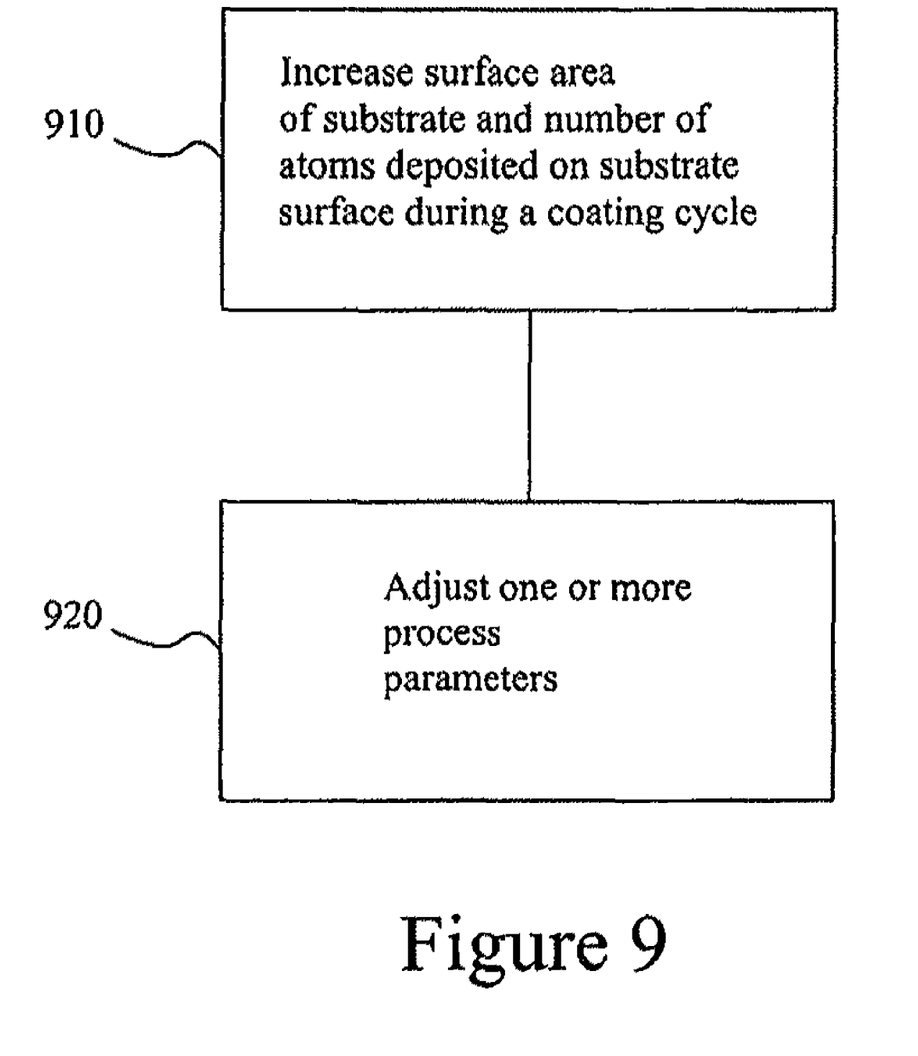
FIG. 9 is a block diagram of a further embodiment of the present subject matter.

It is also an aspect of embodiments of the present subject matter to select operating conditions for the tooling by selecting machine parameters for smooth and continuous motion of rotating substrates. Under the right conditions, the rotation of the substrates may be phased, which is important for even film distribution and oxidation. It is also an aspect of embodiments of the present subject matter to evenly coat substrates with complex multilayer coatings of over four microns in thickness. These coatings may be comprised of layers that require multiple passes past a target and may possess thickness variations of one to two percent. FIG. 9 is a block diagram of one embodiment of the present subject matter. With reference to FIG. 9, a method for forming thin films on substrates is provided using a coating system wherein a number of atoms of an element are deposited on an area of substrate surface during a coating cycle and reacted with another element to form a thin film at a first rate of formation. The method may include increasing the surface area of the substrate and the number of atoms of the element that are deposited on the substrate surface during a coating cycle at step 910. At step 920, one or more process parameters may be adjusted to obtain a rate of formation of the thin film per unit area of substrate surface greater than the product of (i) the ratio of the area of the substrate surface having atoms deposited thereon during a coating cycle to the increased area, and (ii) the first rate of formation of the thin film. Exemplary parameters may include, but are not limited to, substrate rotation rate, substrate rotation direction, sputtering target width, number of sputtering targets, drum diameter, shape of a deposition pattern past a sputtering target, amplitude of a deposition pattern past a sputtering target, masking, phasing of substrate rotation, exposure of the substrate in an oxidation zone, tooling, and combinations thereof.

Figure 10:
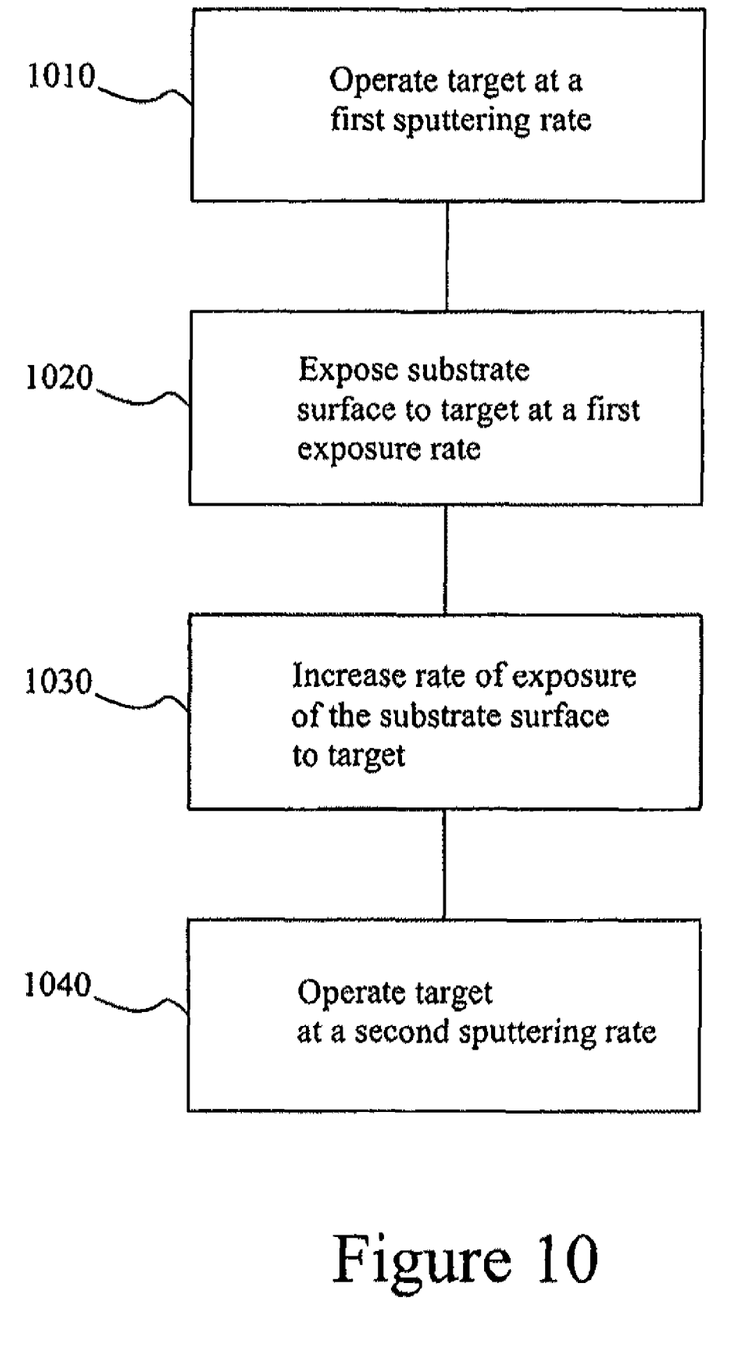
FIG. 10 is a block diagram of another embodiment of the present subject matter.

FIG. 10 is a block diagram of another embodiment of the present subject matter. With reference to FIG. 10, a novel method of forming a non-absorbing thin film on a surface of a substrate is provided where, at step 1010, a sputtering target may be operated at a first sputtering rate of target material and at step 1020, the substrate surface may be exposed to the target at a first exposure rate to effect the deposition of the sputtered target material on the surface of the substrate at a first deposition rate per unit of area of substrate surface. At step 1030, the rate of exposure of the substrate surface to the target may then be increased. The sputtering target may be operated, at step 1040, at a second sputtering rate of the target material so that the deposition rate of sputtered target material per unit of area of substrate surface is greater than the product of (i) the ratio of the first exposure rate of the substrate surface to the increased exposure rate of the substrate surface, and (ii) the first deposition rate per unit of area of substrate surface. In another embodiment, the step of increasing the rate of exposure of the substrate surface to the target may include operating a second sputtering target at a second sputtering rate of target material and exposing the substrate surface to the second target at the first exposure rate to effect the deposition of the sputtered target material on the surface of the substrate at greater than the first deposition rate per unit of area of substrate surface.

Figure 11:
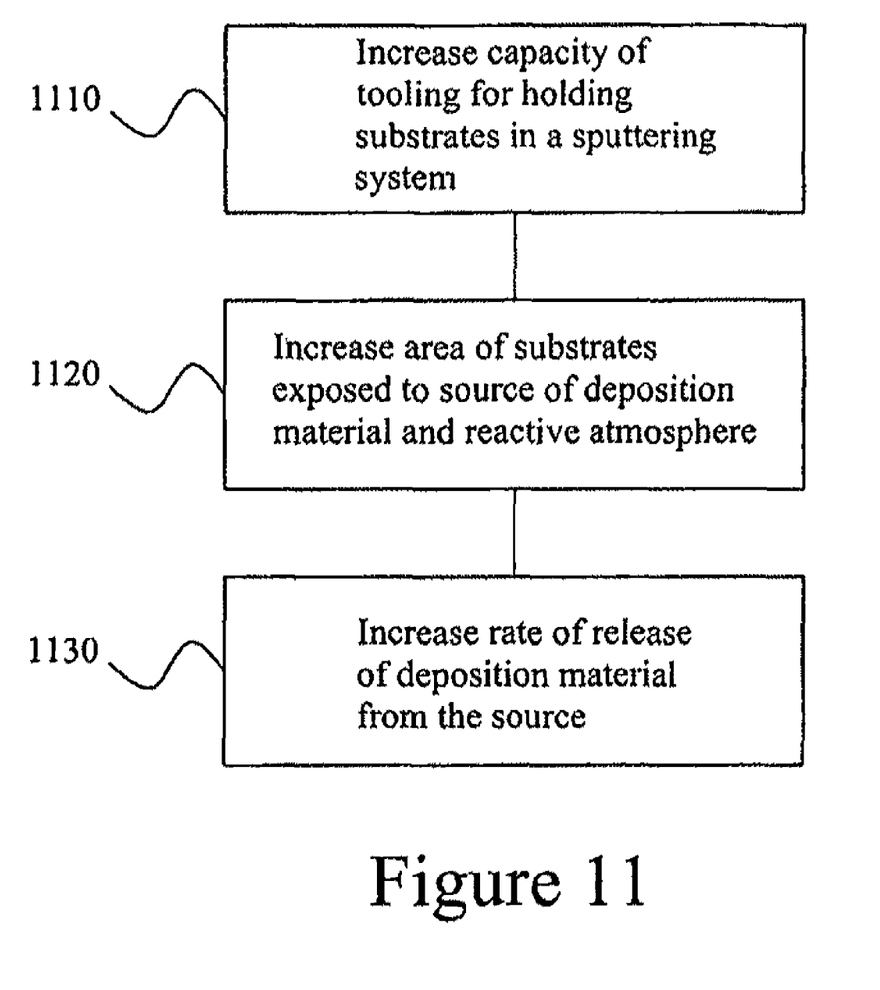
FIG. 11 is a block diagram of an embodiment of the present subject matter.

FIG. 11 is a block diagram of another embodiment of the present subject matter. With reference to FIG. 11, a method of increasing the rate of formation of a substantially non-absorbing thin film on one or more substrates may include at step 1110, increasing the capacity of tooling for holding one or more substrates in an exemplary sputtering system to thereby increase the surface area of substrates held by the tooling. At step 1120, the area of the substrates exposed to a source of deposition material and a reactive atmosphere per unit of time may be increased. The rate of release of the material from the source may then be increased at step 1130 so that the rate of deposition of the material per unit area of substrate is greater than the product of (i) the ratio of the first area per unit of time exposed to the source of deposition material and the reactive atmosphere to the increased area and (ii) the first rate of depositing material per unit area of substrate. In another embodiment, step 1110 may further include providing a plurality of pallets carried by a substrate carrier, each pallet comprising a rotatable central shaft and one or more disks axially aligned along the central shaft, each disk being adapted to carry a plurality of substrates about the periphery of the disk. In a further embodiment, step 1120 may further include adjusting one or more parameters such as, carrier rotation rate, planetary rotation rate, substrate rotation rate, planetary rotation direction, substrate rotation direction, target exposure phasing, reactive atmosphere exposure phasing, and combinations thereof.

Figure 12:
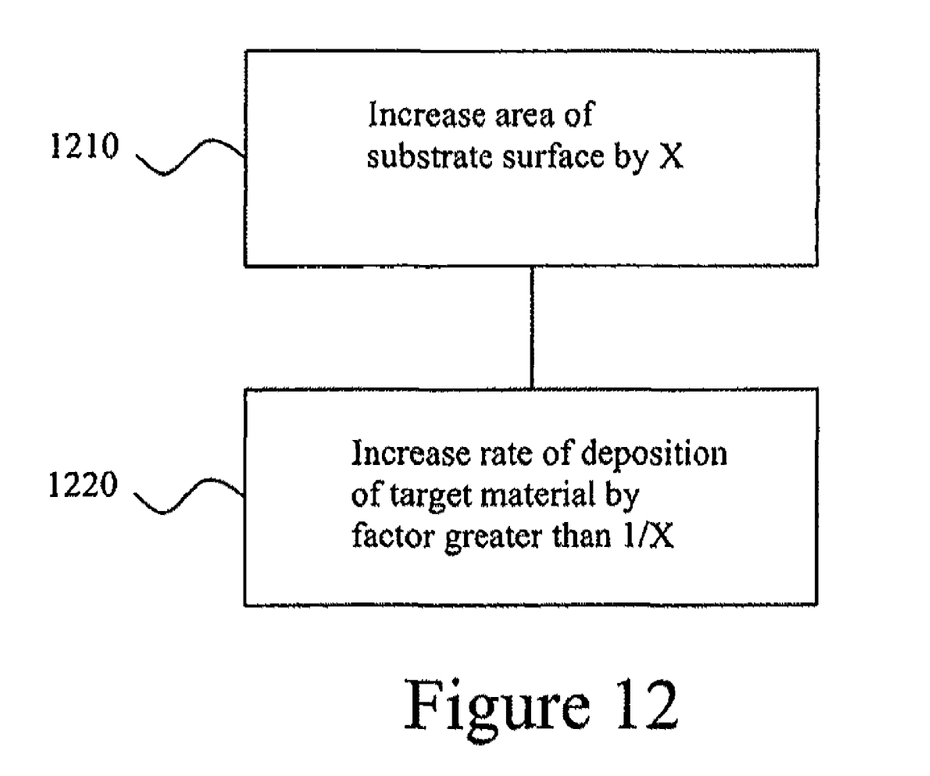
FIG. 12 is a block diagram of one embodiment of the present subject matter.

In one embodiment of the present subject matter a reactive coating system may include a target material deposited and reacted on a substrate surface to form a substantially non-absorbing thin film. FIG. 12 is a block diagram of one embodiment of the present subject matter. With reference to FIG. 12, a method of increasing the volume of the non-absorbing thin film formed per unit of time may include at step 1210, increasing the area of the surface by a factor of "x" and at step 1220 increasing the rate of deposition of the target material by a factor greater than the inverse of the factor "x" to thereby increase the rate of formation of the volume of non-absorbing thin film per unit of time.

While preferred embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What we claim is:

1. A method of forming a non-absorbing thin film on a surface of a substrate, the method comprising:
    operating a sputtering target at a first sputtering rate of target material;
    exposing the substrate surface to the target at a first exposure rate to effect the deposition of the sputtered target material on the surface of the substrate at a first deposition rate per unit of area of substrate surface;
    increasing the rate of exposure of the substrate surface to the target; and
    operating the sputtering target at a second sputtering rate of the target material so that the deposition rate of sputtered target material per unit of area of substrate surface is greater than the product of (i) the ratio of the first exposure rate of the substrate surface to the increased exposure rate of the substrate surface, and (ii) the first deposition rate per unit of area of substrate surface.

2. The method of claim 1 wherein the film includes elements or compounds selected from the group consisting of: $TiO_2$, rutile $TiO_2$, $SiO_2$, Tin-doped Indium Oxide, $Ta_2O_5$, $Nb_2O_5$, other metals and metal oxides, nitrides and carbides utilized to form non-scattering coatings, scattering coatings, or wear coatings, and combinations thereof.

3. The method of claim 1 wherein the substrate is a lamp burner.

4. The method of claim 1 wherein the substrate is a solar mirror.

5. The method of claim 1 wherein the substrate is a lamp reflector.

6. The method of claim 1 wherein the step of increasing the rate of exposure of the substrate surface to the target comprises:
    operating a second sputtering target at a second sputtering rate of target material; and
    exposing the substrate surface to the second target at the first exposure rate to effect the deposition of the sputtered target material on the surface of the substrate at greater than the first deposition rate per unit of area of substrate surface.

7. The method of claim 1 wherein the substrate is selected from the group consisting of: a substantially planar substrate, a drill bit, a lamp, an arcuate substrate, and combinations thereof.

8. In a coating system comprising:
    a source of material to be deposited having a selective rate of release of the material;
    a reactive atmosphere for exposing the deposited material to a reactive agent to effect reaction of the material;
    tooling for holding one or more substrates, the tooling having a capacity determining a first surface area of the substrates held thereby; and
    a carrier supporting the tooling for exposing the substrates held by the tooling to the source of deposition material and the reactive atmosphere at a first area per unit of time to thereby effect a first rate of depositing material per unit area of substrate, a method of increasing the rate of formation of substantially non-absorbing thin film on the one or more substrates, said method comprising:
(a) increasing the capacity of the tooling to thereby increase the surface area of substrates held by the tooling;
(b) increasing the area of the substrates exposed to the source of deposition material and the reactive atmosphere per unit of time; and
(c) increasing the rate of release of the material from the source so that the rate of deposition of the material per unit area of substrate is greater than the product of (i) the ratio of the first area per unit of time exposed to the source of deposition material and the reactive atmosphere to the increased area and (ii) the first rate of depositing material per unit area of substrate.

9. The method of claim 8 wherein the coating system comprises a carrier having a generally circular cross-section and being rotatable about its central axis, and wherein the step of increasing the capacity of the tooling comprises:
providing a plurality of pallets carried by the carrier, each pallet comprising a rotatable central shaft and one or more disks axially aligned along said central shaft, each disk being adapted to carry a plurality of substrates about the periphery of the disk.

10. The method of claim 8 wherein the carrier and tooling move the substrates held by the tooling past the source of deposition material and reactive atmosphere in a first rotational motion while concurrently moving the substrates in a planetary motion and rotating each substrate about its axis.

11. The method of claim 10 wherein the step of increasing the area of the substrates exposed to the source of deposition material and the reactive atmosphere per unit of time comprises:
adjusting one or more parameters selected from the group consisting of: carrier rotation rate, planetary rotation rate, substrate rotation rate, planetary rotation direction, substrate rotation direction, target exposure phasing, reactive atmosphere exposure phasing, and combinations thereof.

12. In a method for forming thin films on substrates using a coating system wherein a number of atoms of an element are deposited on an area of substrate surface during a coating cycle and reacted with another element to form a thin film at a first rate of formation, where the improvement comprises:
increasing the surface area of the substrate on which atoms are deposited and the number of atoms of the element that are deposited on the substrate surface during a coating cycle; and
adjusting one or more process parameters to obtain a rate of formation of the thin film per unit area of substrate surface greater than the product of (i) the ratio of the area of the substrate surface having atoms deposited thereon during a coating cycle to the increased area, and (ii) the first rate of formation of the thin film.

13. In a sputter coating system comprising:
a vacuum chamber having a coating station;
a substrate carrier adapted for passing a plurality of substrates through the coating station, the carrier being configured to carry a first number of substrates;
a means for introducing a reactive gas into said vacuum chamber at a predetermined rate;
a target operating at a first predetermined power level sufficient to create a reactive atmosphere in said coating station and to plasma sputter a selected material onto substrates when passed through said coating station by said substrate carrier; and
a plasma generator operating at a predetermined power level for increasing the area, density and reactivity of the reactive atmosphere in the coating station,
a method for increasing the throughput of substrates having a non-absorbing thin film in the system comprising the steps:
changing the configuration of the substrate carrier to carry a greater number of substrates than the first number; and
operating the target at a second predetermined power level, the second power level being greater than the first power level to thereby increase the rate of plasma sputtering of the material onto the substrates.

14. The method of claim 13 wherein the step of changing the configuration of the substrate carrier comprises configuring the substrate carrier with planetary tooling.

15. In a sputter coating system comprising:
a vacuum chamber;
a drum rotatable about its axis for carrying a plurality of substrates mounted thereon within the vacuum chamber;
a means for introducing a reactive gas into the vacuum chamber at a predetermined reactive gas introduction rate;
a target operating at a target power level sufficient to create a reactive atmosphere in a portion of the chamber and to plasma sputter a selected material onto substrates when carried past the target by the rotating drum; and
a plasma generator operating at a plasma generator power level sufficient to create a reactive atmosphere within a portion of the chamber,
a method of operating the system to form a non-absorbing thin film on the substrates, said method comprising the step:
rotating the drum at a selected frequency whereby an increase in the drum rotation frequency will result in an increase in the absorption property of the thin film when the system is operated at the predetermined reactive gas introduction rate, target power level, and plasma generator power level.

* * * * *